(12) United States Patent
Loiseau et al.

(10) Patent No.: US 12,353,817 B2
(45) Date of Patent: Jul. 8, 2025

(54) PCELL VERIFICATION

(71) Applicant: GlobalFoundries U.S. Inc., Malta, NY (US)

(72) Inventors: Alain F. Loiseau, Williston, VT (US); Romain H. A. Feuillette, Williston, VT (US); Mujahid Muhammad, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 574 days.

(21) Appl. No.: 17/813,344

(22) Filed: Jul. 19, 2022

(65) Prior Publication Data
US 2024/0028811 A1    Jan. 25, 2024

(51) Int. Cl.
*G06F 30/398*    (2020.01)
*G06F 30/392*    (2020.01)

(52) U.S. Cl.
CPC .......... *G06F 30/398* (2020.01); *G06F 30/392* (2020.01)

(58) Field of Classification Search
CPC ...... G06F 30/39; G06F 30/394; G06F 30/398; G06F 30/392; H10D 89/10
USPC ........................................................ 716/119
See application file for complete search history.

(56) References Cited

U.S. PATENT DOCUMENTS

| | | | |
|---|---|---|---|
| 8,910,303 B2 | 12/2014 | Su et al. | |
| 8,977,863 B1 | 3/2015 | Arsintescu | |
| 2013/0311965 A1* | 11/2013 | Cordovez | G06F 30/398 |
| | | | 716/133 |
| 2015/0347667 A1 | 12/2015 | Ellis-Monaghan et al. | |
| 2022/0358273 A1* | 11/2022 | Chang | G06F 30/392 |

* cited by examiner

*Primary Examiner* — Paul Dinh
(74) *Attorney, Agent, or Firm* — David Cain; Hoffman Warnick LLC

(57) ABSTRACT

A process design kit (PDK) is supplied to a layout design tool. The PDK includes parameterized cells (Pcells) adapted to cause the layout design tool to automatically add labels to device layouts in the graphic design system (GDS) file that is being created by the layout design tool. Each corresponding label lists parameters used when creating the corresponding device layout. The GDS file is receive back from the layout design tool. The parameters from the labels is applied to corresponding ones of the Pcells within the PDK to create a device verification layout for each of the device layouts in the GDS file. Each of the device layouts in the GDS file is compared to a corresponding device verification layout. The device layouts within the GDS file that fail to match the corresponding device verification layout are thereby identified.

20 Claims, 4 Drawing Sheets ver: 2.7.1; cell: 2455; A: 22.1; B: 24.6: C: 11.2

PCELL VERIFICATION

BACKGROUND

Field of the Invention

The present disclosure relates to integrated circuit manufacturing and more particularly to verification of parameterized cells (Pcells) within integrated circuit layouts.

Description of Related Art

Modern integrated circuit devices are often generated using information provided in a process design kit (PDK). In one example, Pcells (parameterized cells) are used to automatically create layout instances according to the information within the PDK using electronic design automation (EDA) software. A Pcell layout instance is a part (physical component) of the integrated circuit device whose structure is dependent on one or more parameters of the PDK, and each layout instance of the Pcell is automatically generated based on the values of these parameters.

To efficiently design the complex circuits of a layout, each device of a PDK is generated by setting parameters of the associated Pcell, which allows the EAD to automatically build the different required shapes and layers within the device. Use of Pcells guarantees the integrity of the layout, and its compliance to the necessary manufacturing rules to ensure that the final chip built to the design will work properly. When designing a product, an engineer may "flatten" a Pcell, which breaks the built-in relationship between the shapes and levels of the original device. In other words, when a device is flattened, the engineer can freely move shapes with respect to each other; however, this may result in improper device behavior.

SUMMARY

Some method embodiments herein supply a process design kit (PDK) to a layout design tool. The PDK includes parameterized cells (Pcells) adapted to cause the layout design tool (EAD) to automatically add labels to device layouts in the graphic design system (GDS) file that is being created by the layout design tool. Each corresponding label lists parameters used when creating the corresponding device layout. These methods receive back the GDS file from the layout design tool. With the GDS, these methods apply the parameters from the labels to corresponding ones of the Pcells within the PDK to create a device verification layout for each of the device layouts in the GDS file. This allows these methods to compare each of the device layouts in the GDS file to a corresponding device verification layout. With this, the methods herein identify the device layouts within the GDS file that fail to match the corresponding device verification layout.

Additional methods herein configure, using a processor of a first computerized device, parameterized cells within a process design kit. The configured parameterized cells cause a layout design tool operating on a second computerized device to automatically add labels to device layouts in the graphic design system database file that is being created by the layout design tool. Each corresponding label lists parameters used when creating a corresponding device layout. Such methods supply the process design kit from an input/output device of the first computerized device to the layout design tool operating on the second computerized device. In response, these methods receive (into the input/output device of the first computerized device) the graphic design system database file from the layout design tool. Then, these methods apply (using the processor of the first computerized device) the parameters from the labels to corresponding ones of the parameterized cells within the process design kit to create a device verification layout for each of the device layouts in the graphic design system database file. This allows the methods herein to compare (using the processor of the first computerized device) each of the device layouts in the graphic design system database file to a corresponding device verification layout. Methods herein identify (using the processor of the first computerized device) the device layouts within the graphic design system database file that fail to match the corresponding device verification layout and display the device layouts that fail to match the corresponding device verification layout on a user interface of the first computerized device.

Systems herein include (among other components) a first computerized device that has a storage device. A process design kit is within the storage device. The first computerized device also includes a processor that is adapted to configure parameterized cells within the process design kit. The configured parameterized cells cause a layout design tool (operating on a second computerized device) to automatically add labels to device layouts in a graphic design system database file being created by the layout design tool. Each corresponding label lists parameters used when creating a corresponding device layout. The first computerized device further includes an input/output device adapted to supply the process design kit from of the first computerized device to the layout design tool operating on the second computerized device. The input/output device is adapted to receive the graphic design system database file from the layout design tool. The processor is adapted to apply the parameters from the labels to corresponding parameterized cells within the process design kit to create a device verification layout for each of the device layouts in the graphic design system database file. The processor is also adapted to compare each of the device layouts in the graphic design system database file to a corresponding device verification layout. The processor is adapted to identify the device layouts within the graphic design system database file that fail to match the corresponding device verification layout. The first computerized device further includes a user interface that is adapted to display the device layouts that fail to match the corresponding device verification layout.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
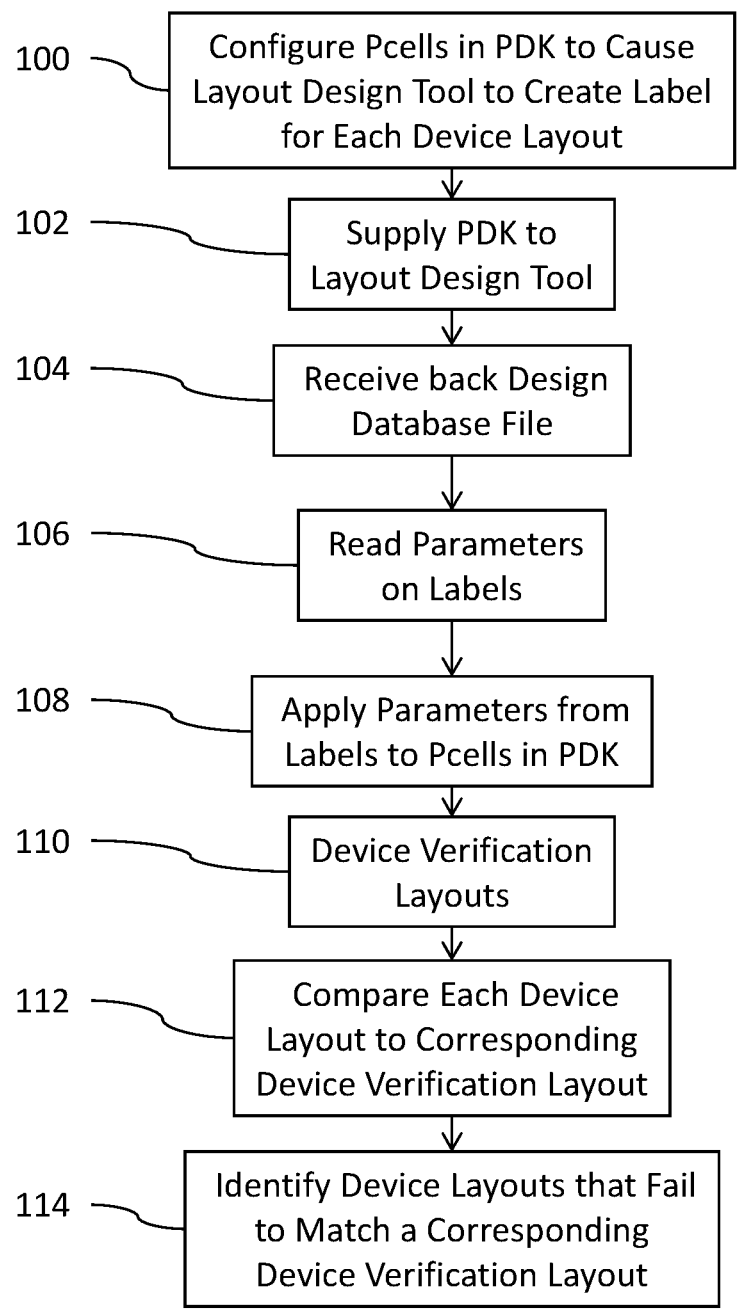
FIG. 1 is a flow diagram illustrating embodiments herein.

As noted above, when designing circuits, engineers can flatten a Pcell and freely move shapes with respect to each other, which may result in improper device behavior. Chip manufacturers (foundries) create a foundry-specific PDK based on the manufacturing equipment and manufacturing processes utilized by that foundry. The foundry-specific PDK has been extensively tested and refined to produce, at the given foundry, wafers and chips efficiently and with high yield rates. Foundries prefer to avoid manufacturing circuits that contain device layouts outside their foundry-specific PDK, because these custom PDKs or custom layouts can produce high defect levels and improper device behavior if manufactured using that foundry's equipment and processes. However, it is difficult for foundries to ensure that designs prepared by others (foundry's customers, clients, etc.) utilize their foundry-specific Pcells. While design rule checking (DRC) applications help, DRCs only check to make sure that the parameters of the Pcells are within minimum and maximum limits and DRCs do not actually check the Pcells themselves for changes from the Pcells in the foundry-specific PDK.

In view of such issues, the systems and methods disclosed herein identify whether the Pcells used to create layouts for devices within a received circuit design database file match the Pcells within the foundry-specific PDK. Thus, the systems and methods herein check whether any Pcells have been modified from the foundry-specific PDK before beginning manufacturing.

In greater detail, the systems and methods herein configure their foundry-specific PDK to contain Pcells that cause the customer's layout design tools to automatically add a (potentially non-printed or substantially invisible) label to each device layout in the customer's circuit design database file being created, as each device is generated by the customer's EAD using the Pcells in the foundry-specific PDK. Each (device-specific) label within the customer's circuit design database file lists the parameters that were used when creating the corresponding device from the Pcell.

In greater detail, for each device in the customer's circuit design database file, the systems and methods apply the list of parameters from the label to a corresponding Pcell within the foundry-specific PDK to recreate a "device verification" layout for each device layout in the customer's circuit design database file. On a shape-by-shape basis, each of the device layouts in the customer's circuit design database file is then compared to a corresponding one of the device verification layouts. The systems and methods herein identify device layouts within the customer's circuit design database file that fail to match (e.g., fail to have the same shape, size, etc. of) the corresponding device verification layout. This highlights whether a customer has modified the Pcells or has created a custom cell. This is also useful to identify which Pcells within the PDK are regularly modified by customers, thereby informing the foundry that the design of such Pcells may need to be updated.

Referring now to the drawings, as shown in item 100 in FIG. 1, various methods herein configure, using a processor of a first computerized device, Pcells within a PDK (foundry-specific PDK). The Pcells are configured in item 100 to cause a layout design tool operating on a second computerized device (e.g., the customer's EAD) to automatically add labels to device layouts in the database file that is being created by the layout design tool. In one example, the database file being generated by the customer's EAD is a GDS (Graphic Design System) file. GDS files can, for example, use a binary (e.g., 0 and 1) file format representing planar geometric shapes, text labels, and other information about an integrated circuit layout in hierarchical form. The shapes in the GDS file can be visually evaluated using, for example, a computer aided design (CAD) application/program. The configuring process in item 100 configures the Pcells to cause the layout design tool (EAD) to add the label to the device layout as each device layout is generated by the layout design tool and such a label can be visible within a CAD application.

More specifically, the processing in item 100 configures the Pcells to cause the layout design tool to have each of the labels include at least: the version identification of the PDK the layout design tool used to create the corresponding one of the device layouts; the name of the Pcell used to create the corresponding one of the device layouts; and the list of parameters used when creating the corresponding device layout. The parameters listed in the labels include all parameters needed to fully recreate the device layouts later.

As shown in item 102, such methods supply this configured PDK from an input/output device of the first computerized device to the layout design tool operating on the second computerized device. In response, in item 104 these methods receive back (e.g., into the input/output device of the first computerized device) the GDS database file from the layout design tool after the customer has used the layout design tool to create the GDS database file.

Then, in item 106 such methods read the labels from the device layouts in the GDS database file using a reader (e.g., the CAD application or similar) of the first computerized device. The configuring of the Pcells in item 100 causes the layout design tool to include the label as a visual/invisible representation of each of the device layouts generated by the customer's EAD (e.g., shows the label as alphanumeric text in a level (e.g., marker level) of the application).

Next, in item 108, these methods apply (using the processor of the first computerized device) the list of parameters from the labels to corresponding ones of the Pcells within the PDK to create a "device verification" layout (shown as item 110) for each of the device layouts in the GDS database file. If the Pcell identified by the label is not within the PDK, the processing in item 108 identifies the Pcell as being a non-PDK Pcell or custom layout.

This allows the methods herein to compare (using the processor of the first computerized device) each of the device layouts in the GDS database file to a corresponding device verification layout in item 112. More specifically, this comparison compares the visual representation of the device layout from the GDS database file with the visual representation of the device verification layout. If there are substantial (e.g., greater that 0%, 5%, 10%, etc.) differences between the relative positions of shapes or sizes of shapes and/or missing shapes, additional shapes, etc., the processing in item 112 will determine that the device layouts in the GDS database file do not match the corresponding device verification layout in item 112. In contrast, if the visual representations of the layouts show matches (possibly within tolerances) between the relative positions of shapes or sizes of shapes (and no missing shapes, additional shapes, etc.), the processing in item 112 will determine that the device layouts in the GDS database file matches the corresponding device verification layout in item 112.

This, in turn, permits methods herein to identify or highlight (using the processor of the first computerized device) the device layouts within the GDS database file that fail to match the corresponding device verification layout and display the device layouts that fail to match the corresponding device verification layout on a user interface of the first computerized device (in item 114). The identifying in item 114 further can also identify the device layouts that do not have labels, or the device layouts that were found to not be within the PDK in item 108.

Figure 2:
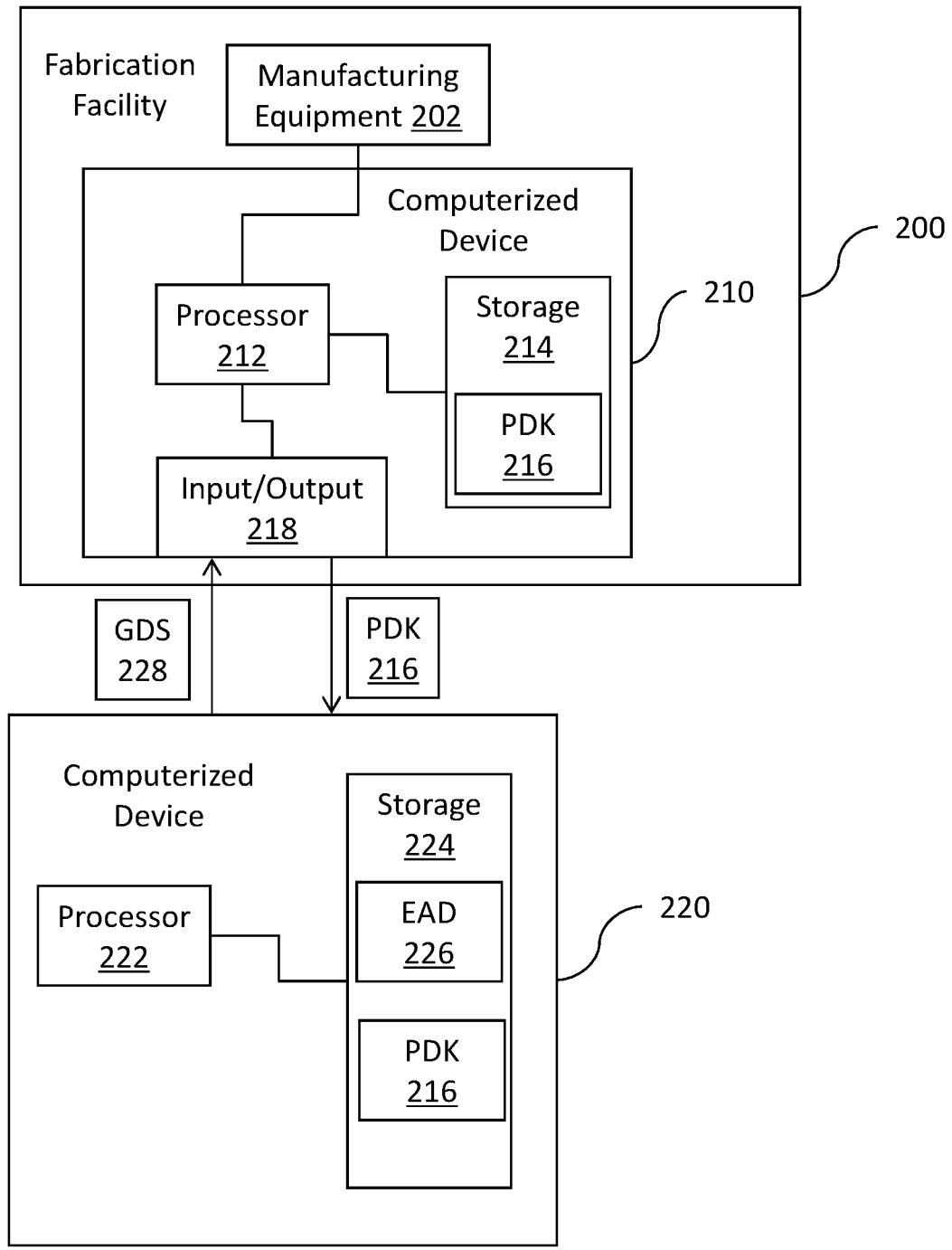
FIG. 2 is a system diagram illustrating embodiments herein.

As shown in FIG. 2, systems 200 herein include (among other components) a first computerized device 210 (or computer system) that has a processor 212 that is connected to, and that controls, a computerized storage 214 device and manufacturing equipment 202. A PDK 216 (foundry-specific PDK 216 to the manufacturing equipment 202 and associated processing techniques) is maintained within the storage 214 device along with other common computer files, applications, and programs.

A second computerized device 220, which can be a customer's computer or computer system for example) is also shown in FIG. 2. The second computerized device 220 similarly includes a second processor 222 connected to a second computerized storage device 224. The second computerized storage device 224 stores a layout design tool, such as the EAD 226 shown in FIG. 2. The first computerized device 210 includes an input/output device 218 adapted to supply the PDK 216 from of the first computerized device 210 to the EAD 226 operating on the second computerized device 220.

As noted above, the processor 212 is adapted to configure Pcells within the PDK 216 to cause the EAD 226 to add a label to each of the device layouts as each device layout is generated by the EAD 226. Specifically, the processor 212 is adapted to configure the Pcells to cause the EAD 226 to have each of the labels include: a version identification of the PDK 216 the EAD 226 used to create the corresponding one of the device layouts; a name of the Pcell used to create the corresponding one of the device layouts; and the list of parameters used when creating the corresponding device layout. The configured Pcells thus cause an EAD 226 (operating on the second computerized device 220) to automatically add such labels to device layouts in a GDS database file 228 being created by the EAD 226. The input/output device 218 is adapted to receive the GDS database file 228 from the EAD 226.

In addition, the processor 212 is adapted to configure the Pcells to cause the EAD 226 to include the label in a specific visual representation of each of the device layouts. Corresponding to this, the first computerized device 210 further includes a reader (such as a CAD application) that is adapted to visually represent (as shapes, text, etc.) the labels from the device layouts in the GDS database file 228. The processor 212 is adapted to apply the list of parameters read from the labels to corresponding Pcells within the PDK 216 to create a device verification layout for each of the device layouts in the GDS database file 228.

The processor 212 is also adapted to compare (on a shape-by-shape basis—for example by performing a pixel-pixel comparison, etc.) each of the device layouts in the GDS database file 228 to a corresponding device verification layout. The processor 212 is adapted to identify the device layouts within the GDS database file 228 that fail to match the corresponding device verification layout. The first computerized device 210 further includes a user interface (e.g., see item 418 in FIG. 4, discussed below) that is adapted to display the device layouts that fail to match the corresponding device verification layout. The processor 212 and the user interface 418 are also adapted to identify ones of the device layouts missing labels or referencing Pcells that are not within the PDK.

Figure 3:
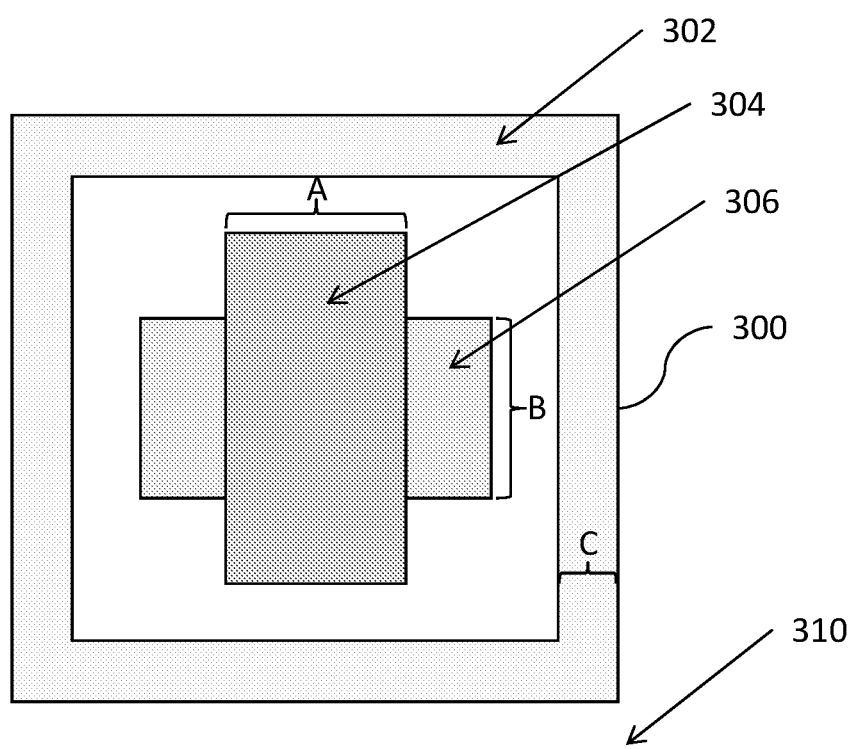
FIG. 3 is a diagram of a device layout showing features of embodiments herein.

Referring to FIG. 3, an image (e.g., as viewed in a CAD application) of an exemplary device layout 300 is shown. Specifically, FIG. 3 illustrates that the device layout 300 includes geometrically shaped conductors, insulators, semiconductors, or doped regions, etc., some of which are identified using numbers 302, 304, and 306. Measurement brackets A, B, and C are not part of the device shown in the device layout 300, but such brackets show dimensions that a DRC application can check for compliance with established minimum measurements and positions.

Additionally, FIG. 3 illustrates a label 310 that appears as a visible alphanumeric string of characters in the CAD representation of the layout. As noted above, the label 310 produced by the EAD 226 using the PDK 216 (see discussion of FIG. 2) can include the version identification of the PDK 216 the EAD 226 used to create the device layout 300 (in the example in FIG. 3: version 2.7.1); the name of the Pcell used to create the device layout 300 (in the example in FIG. 3: 2455); and the list of parameters used when creating the corresponding device layout (in the example in FIG. 3: dimension A is 22.1, dimension B is 24.6, and dimension C is 11.2). Note that the foregoing is an overly simplified example and the number of characters that commonly define parameters of a given Pcell can range in the thousands, and available fields (such a comment fields in the marker layer, etc.) within EAD programs have lengths substantially larger.

Also, the label 310 can be made substantially invisible (non-visible) because the character height can be lowered down to the grid size (0.001 um), which would make the label invisible (or simply appear as a straight solid line) even when going to the transistor level. To view the label 310, methods and systems herein can zoom down to an appropriately sized window (e.g., 0.04 window). In additional options herein the label 310 can be compressed (zipped).

As noted above, the information from the label 310 is used to create a device verification layout and each of the device layouts in the GDS database file 228 is compared to a corresponding device verification layout generated from the label (using the PDK 216). Therefore, with methods and systems herein, if a customer changes a label or removes a label, the device layout will not match the corresponding device verification layout. This prevents customers from hiding custom designs. If the device layout does not match the corresponding device verification layout, the foundry could, for example, not guarantee simulation/yield of custom designs, learn which Pcells need updates (e.g., which require custom modification), and/or gain insight on customer use to detect lack in Pcell offerings, etc.

As is understood, a Pcell represents an IC component and includes an executable parameter customization program (also referred to as a parameter customization script). The IC component represented by a specific Pcell can be a single device (e.g., a transistor, capacitor, resistor, etc.) or multiple interconnected devices (e.g., a logic gate). The customization script allows one or more geometric parameters of one or more devices of an IC component represented by a Pcell to be user-customized through a graphic user interface (GUI). Thus, if multiple instances of a specific Pcell are inserted into an IC design (or representation), at least some of those instances may be user-customized (within limits established in the PDK) so as to have different geometric parameter combinations (also referred to herein as different Pcell configurations). For example, if multiple instances of a transistor Pcell are inserted into a design, at least some of the different instances may be user-customized so as to have different channel length and width combinations (i.e., different Pcell configurations).

The PDK itself is a set of files used to model the fabrication process and PDKs are usually in the form of databases and can include various information such as a device library that has symbols, device parameters, Pcells, etc.; verification decks that provide design rule checking, layout versus schematic checking, antenna and electrical rule checking, physical extraction, etc.; technology data layers, such as layer names, layer/purpose pairs, colors, fills and display attributes, process constraints, electrical rules, etc.; rule files including LEF (library exchange format) files, tool dependent rule format files, etc.; simulation models (SPICE (simulation program with integrated circuit emphasis) for transistors, capacitors, resistors, inductors, etc.; a design rule manual that provides a user friendly representation of the process requirements; as well as other fabrication process information; etc.

For integrated circuit (IC) design and manufacturing, design rule sets are a series of constraints and requirements imposed on the IC design layout to ensure designs function properly, reliably, and can be produced with acceptable yield. Design rules are usually based with one or more design layers (i.e., layers drawn into the design layout).

Among all the design rules, there is a category of the design rules regarding specific devices to ensure such devices can function properly and meet certain standard of reliability (e.g., design rule to check prohibited layers over a certain device, or channel length of a certain device, etc.). Such rules are usually manually created in which the devices are represented by one layer or more layers with Boolean operations among the layers.

Along with the design rules documentation for IC designers to refer to, there are programmed design rules checking (DRC) codes corresponding to the design rules that can be run on an IC verification DRC electronic design automation (EDA) tool to realize automatic design rules checking in an IC layout. The DRC codes are usually created according to the design rules. For example, there are design rules to check the minimum width and area of active silicon (RX) layer, or the minimum spacing between a polysilicon gate conductor (PC) layer and an RX layer, etc.

EDA is a category of software tools for designing electronic systems such as printed circuit boards and integrated circuits. The tools work together in a design flow that chip designers use to design and analyze entire semiconductor chips. The PDK is generally used with a suitable design software tool such as Cadence.

In a PDK, the proper electrical behaviour of each device is guaranteed by a series of ground rules that fix the relative position (spacing, width, and the like) of each shape that belongs to a specific device. For most devices, simple DRC checks are sufficient to verify the proper integrity of the device. As an example, the checking of channel width and length of low voltage FETs is sufficient to guarantee a device behaviour consistent with that of the model. For advanced technology nodes and analogue, RF and power technologies more complex structures such as bipolar transistors, or high voltage FETs are widely used in such advanced products.

Figure 4:
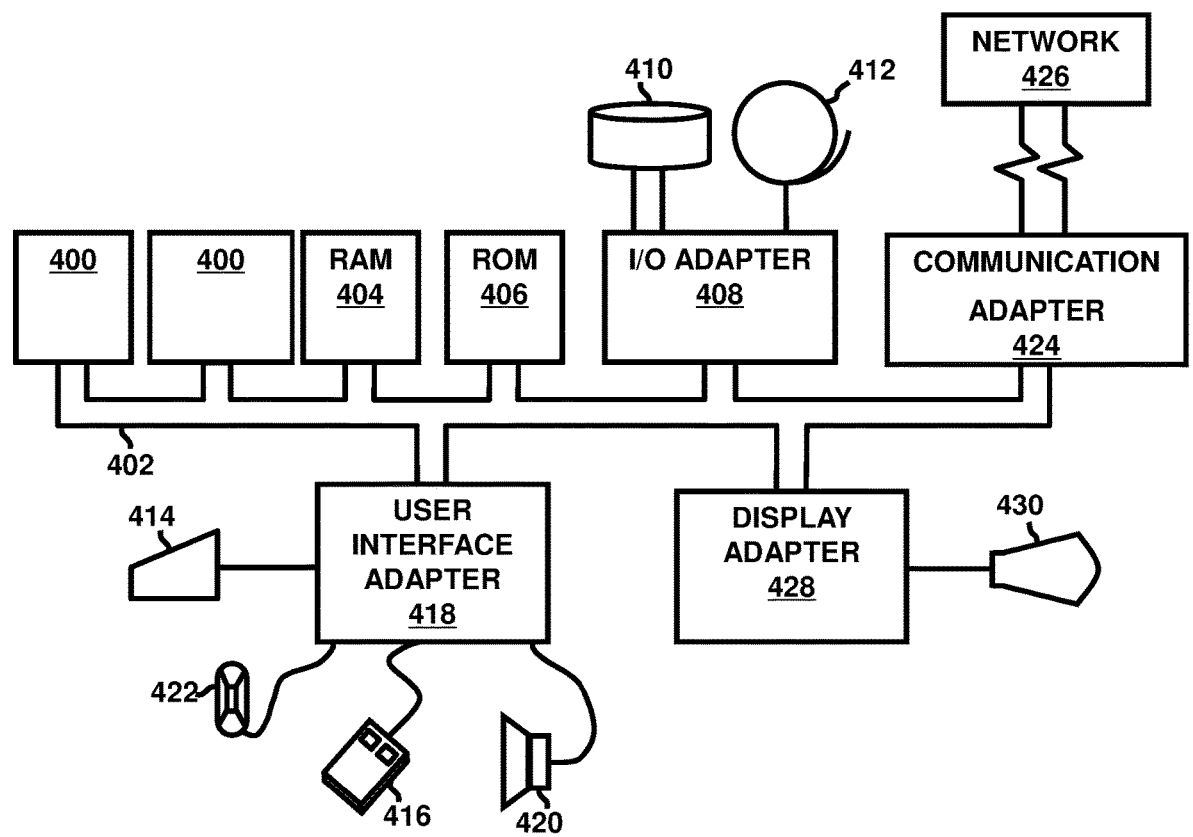
FIG. 4 is a schematic diagram of a hardware system according to embodiments herein.

A representative hardware environment (i.e., a computer system) for implementing the systems, methods and computer program products disclosed above is depicted in FIG. 4. This schematic drawing illustrates a hardware configuration of an information handling/computer system in accordance with the embodiments herein. The system incorporates at least one processor or central processing unit (CPU) 400. The CPUs 400 are interconnected via a system bus 402 to various devices such as a random access memory (RAM) 404, read-only memory (ROM) 406, and an input/output (I/O) adapter 408. The I/O adapter 408 can connect to peripheral devices, such as disk units 410 and tape drives 412, or other program storage devices that are readable by the system. The system can read the inventive instructions on the program storage devices and follow these instructions to execute the methodology of the embodiments herein. The system further includes a user interface adapter 418 that connects a keyboard 414, mouse 416, speaker 420, microphone 422, and/or other user interface devices such as a touch screen device (not shown) to the bus 402 to gather user input. Additionally, a communication adapter 424 connects the bus 402 to a data processing network 426, and a display adapter 428 connects the bus 402 to a display device 430 which may be embodied as an output device such as a monitor, printer, or transmitter, for example.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions, or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
    supplying a process design kit (PDK) to a layout design tool, wherein the PDK includes parameterized cells (Pcells) adapted to cause the layout design tool to automatically add labels to device layouts in a graphic design system (GDS) file being created by the layout design tool, and wherein each corresponding one of the labels lists parameters used when creating a corresponding one of the device layouts;
    receiving the GDS file from the layout design tool;
    applying the parameters from the labels to corresponding ones of the Pcells within the PDK to create a device verification layout for each of the device layouts in the GDS file;
    comparing each of the device layouts in the GDS file to a corresponding device verification layout; and
    identifying device layouts within the GDS file that fail to match the corresponding device verification layout.

2. The method according to claim 1, wherein the Pcells are configured to cause the layout design tool to add the labels to the device layouts as each device is generated by the layout design tool.

3. The method according to claim 1, further comprising reading the labels from the device layouts in the GDS file.

4. The method according to claim 1, wherein the Pcells are configured to cause the layout design tool to have each of the labels include: a version identification of the PDK the layout design tool used to create the corresponding one of the device layouts; and a name of the Pcells used to create the corresponding one of the device layouts.

5. The method according to claim 1, wherein the identifying further identifies ones of the device layouts missing the labels.

6. The method according to claim 1, wherein the configuring configures the Pcells to cause the layout design tool to include the labels in a visual representation of each of the device layouts.

7. The method according to claim 1, wherein the parameters listed on the labels include all parameters needed to fully recreate the device layouts.

8. A method comprising:
    configuring, using a processor of a first computerized device, parameterized cells within a process design kit to cause a layout design tool operating on a second computerized device to automatically add labels to device layouts in a graphic design system database file being created by the layout design tool, wherein each corresponding one of the labels lists parameters used when creating a corresponding one of the device layouts;
    supplying the process design kit from an input/output device of the first computerized device to the layout design tool operating on the second computerized device;
    receiving, by the input/output device of the first computerized device, the graphic design system database file from the layout design tool;
    applying, by the processor of the first computerized device, the parameters from the labels to corresponding ones of the parameterized cells within the process design kit to create a device verification layout for each of the device layouts in the graphic design system database file;
    comparing, by the processor of the first computerized device, each of the device layouts in the graphic design system database file to a corresponding device verification layout;
    identifying, by the processor of the first computerized device, the device layouts within the graphic design system database file that fail to match the corresponding device verification layout; and
    displaying the device layouts that fail to match the corresponding device verification layout on a user interface of the first computerized device.

9. The method according to claim 8, wherein the configuring configures the parameterized cells to cause the layout design tool to add the labels to the device layouts as each of the device layouts is generated by the layout design tool.

10. The method according to claim 8, further comprising reading the labels from the device layouts in the graphic design system database file using a reader of the first computerized device.

11. The method according to claim 8, wherein the configuring configures the parameterized cells to cause the layout design tool to have each of the labels include: a version identification of the process design kit the layout design tool used to create the corresponding one of the device layouts; and a name of the parameterized cells used to create the corresponding one of the device layouts.

12. The method according to claim 8, wherein the identifying further identifies ones of the device layouts missing the labels.

13. The method according to claim 8, wherein the configuring configures the parameterized cells to cause the layout design tool to include the labels in a visual representation of each of the device layouts.

14. The method according to claim 8, wherein the parameters listed on the labels include all parameters needed to fully recreate the device layouts.

15. A system comprising:
a first computerized device having a storage device; and
a process design kit within the storage device,
wherein the first computerized device includes a processor adapted to configure parameterized cells within the process design kit to cause a layout design tool operating on a second computerized device to automatically add labels to device layouts in a graphic design system database file being created by the layout design tool, wherein each corresponding one of the labels lists parameters used when creating a corresponding one of the device layouts,
wherein the first computerized device further comprises an input/output device adapted to supply the process design kit from of the first computerized device to the layout design tool operating on the second computerized device,
wherein the input/output device is adapted to receive the graphic design system database file from the layout design tool,
wherein the processor is adapted to apply the parameters from the labels to corresponding ones of the parameterized cells within the process design kit to create a device verification layout for each of the device layouts in the graphic design system database file,
wherein the processor is adapted to compare each of the device layouts in the graphic design system database file to a corresponding device verification layout,
wherein the processor is adapted to identify the device layouts within the graphic design system database file that fail to match the corresponding device verification layout, and
wherein the first computerized device further comprises a user interface adapted to display the device layouts that fail to match the corresponding device verification layout.

16. The system according to claim 15, wherein the processor is adapted to configure the parameterized cells to cause the layout design tool to add the labels to the device layouts as each of the device layouts is generated by the layout design tool.

17. The system according to claim 15, wherein the first computerized device further comprises a reader adapted to read the labels from the device layouts in the graphic design system database file.

18. The system according to claim 15, wherein the processor is adapted to configure the parameterized cells to cause the layout design tool to have each of the labels include: a version identification of the process design kit the layout design tool used to create the corresponding one of the device layouts; and a name of the parameterized cells used to create the corresponding one of the device layouts.

19. The system according to claim 15, wherein the processor and the user interface are adapted to identify ones of the device layouts missing the labels.

20. The system according to claim 15, wherein the processor is adapted to configure the parameterized cells to cause the layout design tool to include the labels in a visual representation of each of the device layouts.

* * * * *